United States Patent
Cheng et al.

(10) Patent No.: US 9,780,336 B2
(45) Date of Patent: Oct. 3, 2017

(54) ORGANIC LIGHT-EMITTING DISPLAY PANEL AND DISPLAY DEVICE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/434,178

(22) PCT Filed: Aug. 27, 2014

(86) PCT No.: PCT/CN2014/085291
§ 371 (c)(1),
(2) Date: Apr. 8, 2015

(87) PCT Pub. No.: WO2015/158092
PCT Pub. Date: Oct. 22, 2015

(65) Prior Publication Data
US 2016/0197307 A1    Jul. 7, 2016

(30) Foreign Application Priority Data

Apr. 16, 2014 (CN) .......................... 2014 1 0152806

(51) Int. Cl.
*H01L 51/50*    (2006.01)
*H01L 51/52*    (2006.01)
*H01L 27/32*    (2006.01)

(52) U.S. Cl.
CPC ...... *H01L 51/5275* (2013.01); *H01L 27/3244* (2013.01); *H01L 51/5012* (2013.01); *H01L 51/5237* (2013.01); *H01L 2251/303* (2013.01)

(58) Field of Classification Search
None
See application file for complete search history.

(56) References Cited

U.S. PATENT DOCUMENTS 7,202,504 B2  4/2007  Ikeda et al.
7,301,274 B2  11/2007  Tanaka et al.
(Continued)

FOREIGN PATENT DOCUMENTS

CN   1429054 A   7/2003
CN   1599526 A   3/2005
(Continued)

OTHER PUBLICATIONS

International Search Report of PCT/CN2014/085291 in Chinese with English translation, dated Jan. 21, 2015.
(Continued)

*Primary Examiner* — Benjamin Sandvik
(74) *Attorney, Agent, or Firm* — Collard & Roe, P.C.

(57) ABSTRACT

An organic light-emitting display panel and a display device are provided; the display panel includes a first substrate (10) and a second substrate (50), and an electroluminescent layer (30) arranged between the first substrate (10) and the second substrate (50), a plurality of Elm layers (20) being each arranged between the electroluminescent layer (30) and the first substrate (10) as well as between the electroluminescent layer (30) and the second substrate (50), wherein at least one of the first substrate (10) and the second substrate (50) is a light exit surface, refractive indexes of the plurality of film layers between the light exit surface and the electroluminescent layer (30) are not greater than that of the light exit surface, and in any two adjacent film layers between the electroluminescent layer (30) and the light exit surface, a refractive index of a film layer which is far away from the light exit surface is not greater than that of a film layer which is close to the light exit surface.

2 Claims, 1 Drawing Sheet

(56) References Cited

U.S. PATENT DOCUMENTS

| | | | |
|---|---|---|---|
| 7,714,328 B2 | 5/2010 | Miyazawa | |
| 9,312,504 B2* | 4/2016 | Cheng | H01L 21/77 |
| 2005/0285510 A1* | 12/2005 | Han | H01L 51/5262 |
| | | | 313/504 |
| 2007/0262708 A1* | 11/2007 | Tanaka | H01L 27/3244 |
| | | | 313/504 |
| 2008/0218063 A1* | 9/2008 | Greiner | H01L 51/5012 |
| | | | 313/504 |
| 2009/0302750 A1* | 12/2009 | Jun | H01L 51/5265 |
| | | | 313/504 |
| 2012/0169229 A1* | 7/2012 | You | H01L 27/3244 |
| | | | 315/51 |
| 2013/0015450 A1 | 1/2013 | Kim et al. | |
| 2013/0214254 A1 | 8/2013 | Shi et al. | |
| 2014/0183472 A1* | 7/2014 | Kim | H01L 27/3258 |
| | | | 257/40 |
| 2015/0123093 A1 | 5/2015 | Reusch et al. | |

FOREIGN PATENT DOCUMENTS

| | | |
|---|---|---|
| CN | 1645977 A | 7/2005 |
| CN | 1700826 A | 11/2005 |
| CN | 101814560 A | 8/2010 |
| CN | 102664240 A | 9/2012 |
| CN | 102694125 A | 9/2012 |
| CN | 103500754 A | 1/2014 |
| CN | 103682122 A | 3/2014 |
| CN | 103972266 A | 8/2014 |
| JP | 2013-12377 A | 1/2013 |
| WO | 2013/164271 A1 | 11/2013 |

OTHER PUBLICATIONS

Notice of Transmittal of the International Search Report of PCT/CN2014/085291 in Chinese, dated Jan. 21, 2015.

Written Opinion of the International Searching Authority of PCT/CN2014/085291 in Chinese with English translation dated Jan. 21, 2015.

Chinese Office Action in Chinese Application No. 201410152806.2 dated Feb. 29, 2016 with English translation.

Second Chinese Office Action in Chinese Application No. 201410152806.2 dated Nov. 2, 2016 with English translation.

* cited by examiner

ORGANIC LIGHT-EMITTING DISPLAY PANEL AND DISPLAY DEVICE

CROSS REFERENCE TO RELATED APPLICATION

This application is the National Stage of PCT/CN2014/085291 filed on Aug. 27, 2014, which claims priority under 35 U.S.C. §119 of Chinese Application No. 201410152806.2 filed on Apr. 16, 2014, the disclosure of which is incorporated by reference.

TECHNICAL FIELD

Embodiments of the invention relate to an organic light-emitting display panel and a display device.

BACKGROUND

An Organic Light-Emitting Display (OLED) device has advantages such as low energy consumption, high luminance, fast response, wide viewing angle, light weight and the like, and has been recently applied to a mobile communication terminal, a personal digital assistant (PDA), a handheld computer and the like. As compared with a process of fabricating a LCD, a process of fabricating the OLED device is relatively simple, so that the production cost may be lowered. An OLED display panel may generally comprise a top-emitting display panel and a bottom-emitting display panel, and because multiple insulating layers or passivation layers are arranged on the bottom of the bottom-emitting display panel, a luminous efficiency may be influenced. As illustrated in FIG. 1, FIG. 1 illustrates a schematic diagram of light propagation of an organic light-emitting display panel in the prior art, the organic light-emitting display panel comprising a display panel 1 and a plurality of film layers 2. The insulating layers and the passivation layers in the film layers 2 are generally made from a silicon nitride material, the display panel 1 is made from a glass material, and a reflective index of the silicon nitride material is generally greater than that of the glass material, which may result in that most of light rays passing through the insulating layers or passivation layers may be reflected and the other part of light rays are transversely propagated among the layers, and only about 20% of light rays may be emitted from a glass substrate, thereby influencing a luminance of the organic light-emitting display panel, and further affecting a display effect thereof.

SUMMARY OF THE INVENTION

The present invention provides an organic light-emitting display panel and a display device, to improve the luminance of the organic light-emitting display panel, thereby enhancing the display effect of the organic light-emitting display panel.

The present invention provides an organic light-emitting display panel, comprising a first substrate and a second substrate, and an electroluminescent layer arranged between the first substrate and the second substrate, a plurality of film layers being each arranged between the electroluminescent layer and the first substrate as well as between the electroluminescent layer and the second substrate, wherein at least one of the first substrate and the second substrate is a light exit surface, refractive indexes of the plurality of film layers between the light exit surface and the electroluminescent layer are not greater than a refractive index of the light exit surface, and in any two adjacent film layers between the electroluminescent layer and the light exit surface, a refractive index of a film layer which is far away from the light exit surface is not greater than that of a film layer which is close to the light exit surface.

In the above technical solution, by adopting a structure that the refractive indexes of the plurality of film layers are not greater than the refractive index of the light exit surface and in any two adjacent film layers, the refractive index of the film layer which is far away from the light exit surface is not greater than that of the film layer which is close to the light exit surface, it is ensured that more light rays emitted from the electroluminescent layer are refracted on a medium surface, and finally exit from the light exit surface, so that the luminance of the organic light-emitting display panel is improved and further the display effect of the organic light-emitting display panel is enhanced.

In one example, the refractive indexes of a plurality of film layers between the light exit surface and the electroluminescent layer are identical and are less than the refractive index of the light exit surface. Thus, the display effect of the display panel is enhanced.

In one example, the refractive indexes of the plurality of film layers between the light exit surface and the electroluminescent layer are identical with the refractive index of the light exit surface. Thus, the display effect of the display panel is enhanced.

In one example, in a direction away from the light exit surface, the refractive indexes of the plurality of film layers between the light exit surface and the electroluminescent layer sequentially decrease. Thus, the display effect of the organic light-emitting display panel is further enhanced.

In one example, the first substrate is a light exit surface, and the refractive indexes of the plurality of film layers between the first substrate and the electroluminescent layer sequentially decrease in a direction away from the first substrate. Thus, the display effect of a top-emitting organic light-emitting display panel is enhanced.

In one example, the first substrate and the second substrate both are light exit surfaces, the refractive indexes of the plurality of film layers between the first substrate and the electroluminescent layer sequentially decrease in a direction away from the first substrate, and the refractive indexes of the plurality of film layers between the second substrate and the electroluminescent layer sequentially decrease in a direction away from the second substrate. Thus, the display effect of a double-sided-emission organic light-emitting display panel is enhanced.

In one example, the plurality of film layers between the first substrate and the electroluminescent layer include a gate insulating layer, an interlayer insulating layer and a passivation layer which are sequentially stacked in a direction away from the first substrate.

In one example, the plurality of film layers between the first substrate and the electroluminescent layer as well. as the plurality of film layers between the second substrate and the electroluminescent layer are film layers made from $SiO_2$. The refractive indexes of all film layers are reduced, so that the amount of light rays emitted from the display panel is ensured, and the display effect of the organic light-emitting display panel is enhanced.

In one example, the plurality of film layers are $SiO_2$ films prepared by using a PECVD method, and the refractive indexes of the $SiO_2$ films are controlled by controlling at least one of power, reactant gas flow and working pressure.

The present invention further provides a display device, comprising any organic light-emitting display panel as described above.

In the above solution, by adopting a structure that the refractive indexes of the plurality of film layers are not greater than the refractive index of the light exit surface and in any two adjacent film layers, the refractive index of the film layer which is far away from the light exit surface is not greater than that of the film layer which is close to the light exit surface, it is ensured that more light rays emitted from the electroluminescent layer are refracted on a medium surface, and finally exit from the light exit surface, so that the luminance of the organic light-emitting display panel is improved and further the display effect of the organic light-emitting display panel is enhanced.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

To improve a display luminance of an organic light-emitting display panel and further enhance a display effect thereof, embodiments of the present invention provide an organic light-emitting display panel and a display device. In the technical solution of the present invention, by adopting a structure that refractive indexes of film layers adopted are not greater than a refractive index of a material of a light exit surface, more light rays can exit from the light exit surface, so that the luminance of the display panel is improved, and further the display effect of the display panel is enhanced.

Figure 1:
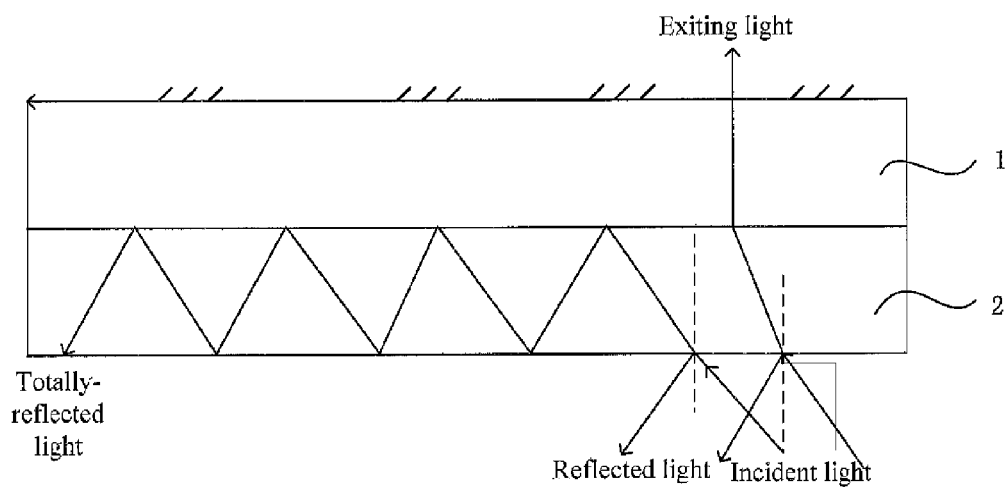
FIG. 1 is a schematic diagram of light illumination of an organic light-emitting display panel in the prior art.
Figure 2:
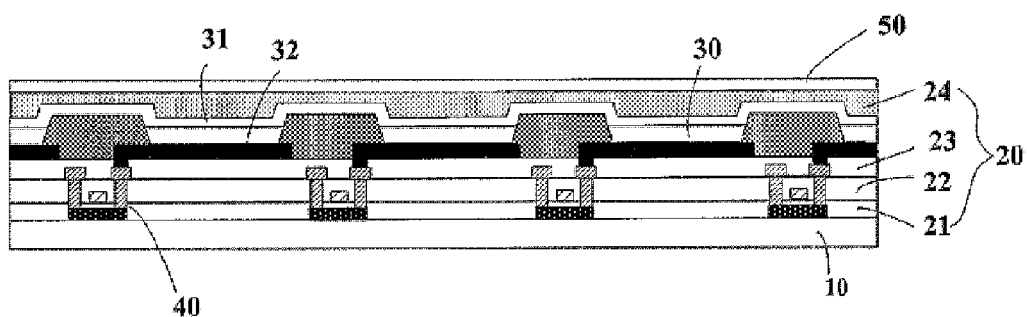
FIG. 2 is a structural schematic diagram of an organic light-emitting display panel provided by an embodiment of the present invention.

As illustrated in FIG. 2, FIG. 2 illustrates a structure of an organic light-emitting display panel provided by this embodiment.

The embodiment of the present invention provides an organic light-emitting display panel. This organic light-emitting display panel comprises: a first substrate 10 and a second substrate 50, and an electroluminescent layer 30 arranged between the first substrate 10 and the second substrate 50, a plurality of film layers 20 being each arranged between the electroluminescent layer 30 and the first substrate 10 as well as between the electroluminescent layer 30 and the second substrate 50. Upon at least one of the first substrate 10 and the second substrate 50 being a light exit surface, refractive indexes of the plurality of film layers 20 between the light exit surface and the electroluminescent layer 30 are not greater than a refractive index of the light exit surface, and in any two adjacent film layers 20, a refractive index of a film layer 20 which is far away from the light exit surface is not greater than that of a film layer 20 which is close to the light exit surface.

In the above embodiment, upon light rays being emitted from the electroluminescent layer 30, the light rays irradiated from the first electroluminescent layer 30 to the light exit surface need to pass through the plurality of film layers 20. It can be appreciated according to light propagation characteristics that, upon light entering from one medium to another medium, part of light rays are refracted, and the other part of light rays are reflected; upon the light rays entering a medium with a low refractive index from a medium with a high refractive index, the light rays may be reflected at a smaller incident angle, and therefore, to improve the display luminance of the organic light-emitting display panel, the refractive indexes of the plurality of film layers 20 in the organic light-emitting display panel provided by this embodiment are not greater than the refractive index of the light exit surface, and meanwhile, to ensure that more light rays are emitted upon light being propagated from one film layer 20 to another film layer 20, a structure that in any two adjacent film layers 20, the refractive index of the film layer 20 which is far away from the light exit surface is not greater than that of the film layer 20 which is close to the light exit surface is adopted, so as to ensure that more light rays may pass through, so that an amount of the light rays emitted from the display panel is increased, and the display luminance of the display panel is further improved.

To make more light rays emitted, the refractive indexes of the film layers 20 satisfy: the refractive indexes of the plurality of film layers 20 between the light exit surface and the electroluminescent layer 30 are not greater than the refractive index of the light exit surface and in any two adjacent film layers 20, the refractive index of the film layer 20 which is far away from the light exit surface is not greater than that of the film layer 20 which is close to the light exit surface. There can be multiple specific cases, for example, the refractive indexes of the plurality of film layers 20 between the light exit surface and the electroluminescent layer 30 are identical and are less than the refractive index of the light exit surface; or the refractive indexes of the plurality of film layers 20 between the light exit surface and the electroluminescent layer 30 are all identical with the refractive index of the light exit surface; preferably, the refractive indexes of the plurality of film layers 20 between the light exit surface and the electroluminescent layer 30 sequentially decrease in a direction away from the light exit surface. Thus, it is ensured that more light rays can be emitted from the light exit surface, so that the display luminance of the organic light-emitting display panel is improved.

In the organic light-emitting display panel, the first substrate 10 and the second substrate 50 may both serve as light exit surfaces, and its structures are described below with specific implementations.

To facilitate the description of the film layers 20, they are described with the organic light-emitting display panel illustrated in FIG. 2 as an example; the organic light-emitting display panel comprises: a first substrate 10 and a second substrate 50, and an electroluminescent layer 30 arranged between the first substrate 10 and the second substrate 50. A thin film transistor 40 is arranged between the first substrate 10 and the electroluminescent layer 30, and a gate insulating layer 21, an interlayer insulating layer 22 and a first passivation layer 23 are sequentially stacked in a direction away from the first substrate 10; the film layer 20 arranged between the second substrate 50 and the electroluminescent layer 30 is a second passivation layer 24, and the electroluminescent layer 30 includes a cathode 31 and an anode 32. It should be understood that the display panel may select a top gate structure or may select a bottom gate structure, and principles thereof are the same. Upon the first substrate 10 being a light exit surface, light rays are emitted from the anode 32, and the cathode 31 is a lightproof layer; upon the second substrate 50 being a light exit surface, the light rays are emitted from the cathode 31, and the anode 32 is a lightproof layer. For the sake of convenience of description, the refractive indexes of the first substrate 10 and the second substrate 50 are set to n0, the refractive index of the gate insulating layer 21 is set to n1, the refractive index of the interlayer insulating layer is set to n2, the refractive index of the first passivation layer is set to n3, and the refractive index of the second passivation layer 24 is set to n4.

Embodiment 1

With further reference to FIG. 2, the first substrate 10 is a light exit surface, and the refractive indexes of the plurality of film layers 20 between the first substrate 10 and the electroluminescent layer 30 sequentially decrease in a direction away from the first substrate 10.

Specifically, as illustrated in FIG. 2, the film layers 20 sequentially arranged in the direction away from the first substrate 10 are respectively: a gate insulating layer 21, an interlayer insulating layer 22 and a first passivation layer 23; in order to enhance the display effect of the organic light-emitting display panel, the refractive indexes of the film layers satisfy: n3<n2<n1<n0, such that upon light rays emitted from the anode 32 of the electroluminescent layer 30 passing through respective film layers 20, more light rays are refracted, and finally exit from the first substrate 10. Therefore, the display luminance of the organic light-emitting display panel is improved, further the display effect of the organic light-emitting display panel is enhanced, and the energy consumption of the organic light-emitting display panel is reduced.

To facilitate satisfying a relationship of the refractive indexes of the film layers 20, the above film layers 20 are all made from a $SiO_2$ material, and upon the $SiO_2$ material being used for preparing the film layers 20, the difference of the refractive indexes of the prepared film layers 20 may be realized by its preparing conditions. In specific productions:

A $SiO_2$ thin film is deposited by using a PECVD method, which has advantages such as high hardness, good abrasive resistance, good adiathermancy and strong anti-erosion capability as well as good dielectric properties, and usually serves as a metal interlayer medium, a passivation layer and the like. The refractive index of the deposited $SiO_2$ thin film may be controlled by means of controlling a pressure intensity and a temperature of a depositing cavity, a gas flow rate, a flow rate ratio and a power.

The $SiO_2$ thin film is deposited by using the PECVD method, typically, silane ($SiH_4$) and laughing gas ($N_2O$) react under a plasma state at a process temperature of generally lower than 350° C.;

A reaction equation is:

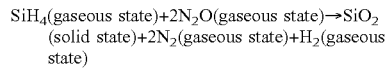

$SiH_4$(gaseous state)+$2N_2O$(gaseous state)→$SiO_2$ (solid state)+$2N_2$(gaseous state)+$H_2$(gaseous state)

The refractive index may be controlled by means of changing process conditions when $SiO_2$ is prepared, and variable process conditions are as follows:

(1) Specific process parameters of changing the refractive index of $SiO_2$ by controlling a power parameter are as follows:

$SiH_4$ flow—45 sccm, $N_2O$ flow—365 sccm, $N_2$ flow—790 sccm, pressure—600 mT, time—4 min, and power—30 W to 300 W;

In a case where other conditions are unchangeable, with the increase of the power, the refractive index of the thin film substantially decrease, and is less than 1.46 after the power is greater than 75 W, which deviates from a common refractive index of the $SiO_2$ (1.46 to 1.52). Therefore, by means of controlling such a parameter of the power, the refractive indexes of three layers of $SiO_2$ may be controlled to be all less than or equal to the refractive index n0 of glass, and satisfy n3≤n2≤n1≤n0 (the refractive index of the glass is generally between 1.5 and 1.9).

(2) Specific process parameters of changing the refractive index of the $SiO_2$ by controlling the gas flow rate of a reactant gas of $N_2O$ are as follows:

The $N_2O$ flow is changed, and the $N_2$ flow is changed simultaneously in order to maintain the total flow of $N_2O$ and $N_2$ unchanged;

$SiH_4$ flow—8 sccm, pressure—600 mT, power—60 W, time—5 min, $N_2O$ flow—35 sccm~756 sccm, and $N_2$ flow—1120 sccm~390 sccm; when the $N_2O$ flow is changed, the refractive indexes of the three layers of $SiO_2$ may be controlled to be all less than the refractive index n0 of the glass by means of controlling the $N_2O$ flow, that is, with the increase of the $N_2O$ flow, the refractive index of the $SiO_2$ decreases.

(3) Specific process parameters of changing the refractive index of the $SiO_2$ by changing a working pressure are as follows:

$SiH_4$ flow—45 sccm, $N_2O$ flow—165 sccm, $N_2$ flow—990 sccm, power—60 W, time—4 min, pressure—200 mT~1000 mT; and with the increase of the pressure, the refractive index of the thin film gradually decreases.

By controlling the film layers 20 made from the $SiO_2$, the refractive indexes of the film layers 20 produced may be controlled according to a process of producing the film layers 20, so as to facilitate the preparation of the organic light-emitting display panel.

It should be understood that the refractive indexes of the plurality of film layers 20 provided by this embodiment are not limited to a relationship among the refractive indexes of the film layers 20 provided by the above specific embodiment. Other modes may also be adopted, which only need to satisfy such a condition that: the refractive indexes of the plurality of film layers 20 between the above light exit surface and the electroluminescent layer are not greater than the refractive index of the light exit surface, and in any two adjacent film layers 20, the refractive index of the film layer 20 which is far away from the light exit surface is not greater than that of the film layer 20 which is close to the light exit surface. For example, formulas of n3≤n2≤n1≤n0, or n3<n2≤n1≤n0, or n3<n2<n1≤n0, or n3≤n2<n1≤n0 and the like all may improve the display luminance of the organic light-emitting display panel, and further enhance the display effect of the organic light-emitting display panel.

Embodiment 2

With further reference to FIG. 2, the second substrate 50 is a light exit surface, and the refractive indexes of a plurality of film layers 20 between the second substrate 50 and the electroluminescent layer 30 sequentially decrease in a direction away from the second substrate 50.

Specifically, as illustrated in FIG. 2, taking the light-emitting display panel illustrated in FIG. 2 as example, the film layer 20 arranged between the second substrate 50 and the electroluminescent layer 30 is a second passivation layer 24, and the refractive index n4 of the second passivation layer 24 is less than the refractive index n0 of the second substrate 50, thereby ensuring that upon light rays being emitted from the cathode 31 of the electroluminescent layer 30, more light rays can pass through the second substrate 50, so that the display luminance of the organic light-emitting display panel is improved, and further the display effect of the organic light-emitting display panel is enhanced; compared with a display panel in the prior art, the organic light-emitting display panel has the energy consumption reduced under the same luminance.

Therein, the second passivation layer 24 is a film layer 20 made from a $SiO_2$ material, a specific processing technology of which is identical with that of the $SiO_2$ as described in Embodiment 1, which will not be repeated here.

It should be understood that, the film layer 20 described in this embodiment is not limited to a structure of a second passivation layer 24 of the organic light-emitting display panel as illustrated in FIG. 2, and should also comprise organic light-emitting display panels of other structures, for example, an organic light-emitting display panel with multiple encapsulating film layers 20, and its refractive index should also satisfy a condition that the refractive indexes of the plurality of film layers between the light exit surface and the electroluminescent layer 30 are not greater than the refractive index of the light exit surface, and in any two adjacent film layers 20, the refractive index of the film layer 20 which is far away from the light exit surface is not greater than that of the film layer 20 which is close to the light exit surface. Its principle is identical with that of the above specific embodiment, which will not be repeated here.

Embodiment 3

With further reference to FIG. 2, a first substrate 10 and a second substrate 50 both are light exit surfaces, and the refractive indexes of a plurality of film layers 20 between the first substrate 10 and an electroluminescent layer 30 sequentially decrease in a direction away from the first substrate 10.

Specifically, the refractive indexes of the plurality of film layers 20 between the first substrate 10 and the electroluminescent layer 30 sequentially decrease in a direction away from the first substrate, and the refractive indexes of the plurality of film layers 20 between the second substrate 50 and the electroluminescent layer 30 sequentially decrease in a direction away from the second substrate. With a flexible substrate illustrated in. FIG. 2 as an example, refractive indexes of the first substrate 10, a gate insulating layer 21, an interlayer insulating layer 22, a first passivation layer 23, a second passivation layer 24 and the second substrate 50 satisfy: $n3<n2<n1<n0$, and $n4<n0$, thereby ensuring that when the first substrate 10 and the second substrate 50 both are display panels, light rays emitted from a cathode 31 and an anode 32 of the electroluminescent layer 30 may maximally pass through the second substrate 50 and the first substrate 10, so that the display luminance of the organic light-emitting display panel is improved and further the display effect of the organic light-emitting display panel is enhanced.

Therein the plurality of film layers 20 all are film layers made from a $SiO_2$ material, and a fabricating method of the film layers is identical with the manner listed in Embodiment 1, which will not be repeated here.

It should be understood that, corresponding relationships among the refractive indexes of all film layers of the organic light-emitting display panel provided by this embodiment are not limited to relationships of relational expressions particularly listed above, and may also be any other corresponding relationships satisfying such a condition that the refractive indexes of the plurality of film layers between the light exit surface and the electroluminescent layer 30 are not greater than the refractive index of the light exit surface, and in any two adjacent film layers 20, the refractive index of the film layer 20 which is far away from the light exit surface is not greater than that of the film layer 20 which is close to the light exit surface. Its principle is identical with principles of Embodiment 1 and Embodiment 2 described above, which will not be repeated here.

It can be seen that from the description of the above specific embodiment, the organic light-emitting display panel provided by this embodiment ensures that light rays emitted from the electroluminescent layer 30 may maximally exit from the light exit surface by means of improving the corresponding relationships among the refractive indexes of the film layers 20, thereby improving the luminance of the organic light-emitting display panel and further enhancing the display effect of the organic light-emitting display panel.

An embodiment of the present invention further provides a display device, and this display device comprises any organic light-emitting display panel as described above. Specifically, the display device may be a liquid crystal panel, electronic paper, a mobile phone, a panel personal computer, a television, a display, a notebook computer, a digital photo frame, a navigator, or any product or component with a display function. The display device has a good display effect.

The foregoing embodiments merely are exemplary embodiments of the invention, and not intended to define the scope of the invention, and the scope of the invention is determined by the appended claims.

The present application claims priority of Chinese Patent Application No. 201410152806.2 filed on Apr. 16, 2014, the disclosure of which is incorporated herein by reference in its entirety as part of the present application.

What is claimed is:

1. An organic light-emitting display panel, comprising: a first substrate and a second substrate, and an electroluminescent layer arranged between the first substrate and the second substrate;
   wherein a thin film transistor is arranged between the first substrate and the electroluminescent layer, and a gate insulating layer, an interlayer insulating layer and a first passivation layer each being a $SiO_2$ film layer are sequentially stacked in a direction away from the first substrate; and a second passivation layer being a $SiO_2$ film layer is arranged between the second substrate and the electroluminescent layer,
   wherein both of the first substrate and the second substrate are a light exit surface, given that the refractive indexes of first substrate and the second substrate are n0, the refractive of the gate insulating layer is n1, the refractive index of the interlayer insulating layer is n2, the refractive index of the passivation layer is n3, and the refractive index of the second passivation layer is n4, $n3<n2<n1<n0$ and $n4<n0$.

2. A display device, comprising the organic light-emitting display panel according to claim 1.

* * * * *